United States Patent
Heuwieser et al.

(10) Patent No.: US 10,844,513 B2
(45) Date of Patent: Nov. 24, 2020

(54) METHOD FOR PRODUCING A SEMICONDUCTOR WAFER OF MONOCRYSTALLINE SILICON, DEVICE FOR PRODUCING A SEMICONDUCTOR WAFER OF MONOCRYSTALLINE SILICON AND SEMICONDUCTOR WAFER OF MONOCRYSTALLINE

(71) Applicant: SILTRONIC AG, Munich (DE)

(72) Inventors: Walter Heuwieser, Stammham (DE); Dieter Knerer, Haiming (DE); Werner Schachinger, Simbach (DE); Masamichi Ookubo, Yamaguchi (JP)

(73) Assignee: SILTRONIC AG, Munich (DE)

( * ) Notice: Subject to any disclaimer, the term of this patent is extended or adjusted under 35 U.S.C. 154(b) by 53 days.

(21) Appl. No.: 16/095,320

(22) PCT Filed: May 17, 2017

(86) PCT No.: PCT/EP2017/061784
§ 371 (c)(1),
(2) Date: Oct. 19, 2018

(87) PCT Pub. No.: WO2017/202656
PCT Pub. Date: Nov. 30, 2017

(65) Prior Publication Data
US 2019/0136404 A1    May 9, 2019

(30) Foreign Application Priority Data
May 24, 2016    (DE) ........................ 10 2016 209 008

(51) Int. Cl.
C30B 15/14    (2006.01)
C30B 15/04    (2006.01)
(Continued)

(52) U.S. Cl.
CPC .............. *C30B 15/04* (2013.01); *C30B 15/14* (2013.01); *C30B 15/203* (2013.01);
(Continued)

(58) Field of Classification Search
CPC .......... C30B 15/00; C30B 15/02; C30B 15/14
See application file for complete search history.

(56) References Cited

U.S. PATENT DOCUMENTS 5,137,699 A * 8/1992 Azad ....................... C30B 15/00
117/202
5,402,747 A    4/1995 Kobayashi et al.
(Continued)

FOREIGN PATENT DOCUMENTS

CN    101521199 A    9/2009
CN    102108549 A    6/2011
(Continued)

*Primary Examiner* — Robert M Kunemund
(74) *Attorney, Agent, or Firm* — Brooks Kushman P.C.

(57) ABSTRACT

Single crystal semiconductor wafers comprise oxygen and an n-type dopant, and are produced by a process comprising providing a silicon melt containing n-type dopant in a quartz crucible, the melt having an initial height hM;
heating the melt from the side by selectively supplying heat to an upper volume of the melt having an initial height hm, wherein hm is smaller than hM;
pulling a single crystal of silicon from the melt by the CZ method with a pulling velocity V;
heating the melt from above in the region of a phase boundary between the growing single crystal and the melt;
heating the melt from above in the region of a surface of the melt;
subjecting the melt to a magnetic field;
counterdoping the melt with p-type dopant; and
(Continued)

separating the semiconductor wafer of single-crystal silicon from the single crystal. An apparatus for accomplishing the process is also disclosed.

20 Claims, 4 Drawing Sheets

(51) Int. Cl.
- *C30B 15/20* (2006.01)
- *C30B 15/30* (2006.01)
- *C30B 29/06* (2006.01)
- *C30B 30/04* (2006.01)

(52) U.S. Cl.
CPC ............ *C30B 15/305* (2013.01); *C30B 29/06* (2013.01); *C30B 30/04* (2013.01)

(56) References Cited

U.S. PATENT DOCUMENTS

| | | |
|---|---|---|
| 6,007,625 A | 12/1999 | Tomioka et al. |
| 6,080,238 A * | 6/2000 | Ito .......................... C30B 15/14 117/217 |
| 6,132,507 A | 10/2000 | von Ammon et al. |
| 2004/0192015 A1 | 9/2004 | Ammon et al. |
| 2007/0193501 A1 | 8/2007 | Ono et al. |
| 2007/0215038 A1 | 9/2007 | Iida et al. |
| 2008/0187736 A1 | 8/2008 | Sattler et al. |
| 2009/0218661 A1 | 9/2009 | Kurita et al. |
| 2011/0156216 A1 | 6/2011 | Nakai et al. |
| 2011/0214604 A1 | 9/2011 | Takano |
| 2013/0014695 A1 | 1/2013 | Knerer et al. |
| 2013/0264685 A1 | 10/2013 | Qu et al. |
| 2013/0323153 A1 | 12/2013 | Hoshi et al. |
| 2015/0349066 A1 | 12/2015 | Caspary et al. |
| 2017/0260645 A1 | 9/2017 | Hoshi et al. |

FOREIGN PATENT DOCUMENTS

| | | |
|---|---|---|
| CN | 103328696 A | 9/2013 |
| CN | 103429798 A | 12/2013 |
| DE | 10 2011 079 284 B3 | 11/2012 |
| EP | 0 926 270 A1 | 6/1999 |
| JP | 05294782 A | 9/1993 |
| JP | 2001-31495 A | 2/2001 |
| JP | 2004-292309 A | 10/2004 |
| JP | 2005-145742 A | 6/2005 |
| JP | 2008-189544 A | 8/2008 |
| JP | 2011-051805 A | 3/2011 |
| JP | 2016-50140 A | 4/2016 |
| TW | 541363 B | 7/2003 |
| TW | I281695 | 5/2007 |
| WO | 2014/190165 A2 | 11/2014 |

* cited by examiner

METHOD FOR PRODUCING A SEMICONDUCTOR WAFER OF MONOCRYSTALLINE SILICON, DEVICE FOR PRODUCING A SEMICONDUCTOR WAFER OF MONOCRYSTALLINE SILICON AND SEMICONDUCTOR WAFER OF MONOCRYSTALLINE

CROSS REFERENCE TO RELATED APPLICATIONS

This application is the U.S. National Phase of PCT Appln. No. PCT/EP2017/061784 filed May 17, 2017, which claims priority to German Application No. 10 2016 209 008.9 filed May 24, 2016, the disclosures of which are incorporated in their entirety by reference herein.

BACKGROUND OF THE INVENTION

1. Field of the Invention

The invention relates to a process for producing a semiconductor wafer of single-crystal silicon which comprises oxygen and at least one n-type dopant, wherein the oxygen concentration and the radial variation of the oxygen concentration are comparatively low. The invention also relates to an apparatus suitable for producing the semiconductor wafer and also to a semiconductor wafer having the above-mentioned properties and having a diameter of at least 300 mm.

2. Description of the Related Art

A semiconductor wafer of single crystal silicon having the abovementioned properties is a substrate used in particular to produce electronic components based on insulated gate bipolar transistors, IGBTs. The oxygen concentration of the substrate must be as low as possible because, in the course of production of electronic components, oxygen contributes to the formation of thermal donors which can alter electrical resistance to the detriment of the serviceability of the components. The requirement that the oxygen concentration of the substrate must be comparatively low is a challenge, in particular when the semiconductor wafer is at the same time expected to have a diameter of at least 300 mm.

In such circumstances the single crystal from which the semiconductor wafer is separated must be grown by the CZ method. Growing a single crystal of silicon by the CZ method comprises melting polycrystalline silicon in a quartz crucible, submerging a seed crystal in the resulting melt and pulling the seed crystal upward to initiate crystallization of material on the underside of the seed crystal while the quartz crucible and the seed crystal are rotated. A portion of this material forms a single crystal of silicon from which single-crystal semiconductor wafers of silicon are generally separated.

The silicon melt dissolves oxygen out of the crucible material. This oxygen is partly incorporated into the growing single crystal and partly escapes from the melt in the form of gaseous SiO. Particular measures must be taken to ensure that the oxygen concentration in the single crystal remains low enough for the single-crystal material to be suitable for producing IGBTs.

On the other hand the presence of oxygen in the crystal lattice strengthens the resistance of the semiconductor wafer of single-crystal silicon against slip by thermally or mechanically introduced stresses. When the oxygen concentration in the single crystal is comparatively low, one is faced with the problem that semiconductor wafers of single-crystal silicon that are separated from such a single crystal exhibit a drop in the oxygen concentration in the edge region and the edge region is particularly susceptible to slip.

When doping the melt with n-type dopants, for example with phosphorus, the dopant accumulates in the melt with the increasing crystallization of the single crystal. Because of this "segregation effect" the specific resistance in the single crystal falls in the direction toward the lower end of the single crystal. Semiconductor wafers that are separated from the single crystal and that are to be suitable as substrates for producing IGBTs may differ in terms of their electrical properties only very slightly. In order to counteract a reduction in the specific resistance over the length of the single crystal it is possible to add a p-type dopant to the melt, for example boron, to compensate for the segregation-induced increase in charge carriers. This measure is referred to as "counterdoping" and is described in detail in US2015/0 349 066 A1 for example.

US2007/0 193 501 A1 describes the production of a semiconductor wafer of single-crystal silicon having an oxygen concentration of not more than $4.33 \times 10^{17}$ atoms/$cm^3$, the reported value therein being converted to new ASTM value. The examples contained in the document show that semiconductor wafers having a converted concentration of $2.6 \times 10^{17}$ atoms/$cm^3$ were indeed produced. The production process described in the document comprises growing a single crystal of silicon by the CZ method using counterdoping to enhance the yield.

EP 0 926 270 A1 discloses a ring-shaped heating apparatus, the use of which facilitates the escape of SiO via the surface of the melt.

SUMMARY OF THE INVENTION

The present invention has for its object to provide n-type-doped semiconductor wafers of single-crystal silicon having even lower oxygen concentrations, in particular wafers where the radial variation of the oxygen concentration is reduced, and to increase the yield of such semiconductor wafers. These and other objects are achieved by a process for producing a semiconductor wafer of single-crystal silicon which comprises oxygen and at least one n-type dopant, comprising providing a melt of silicon which comprises n-type dopant in a quartz crucible, wherein the melt has an initial height hM;

heating the melt from the side by selectively supplying heat to an upper volume of the melt having an initial height hm, wherein the height hm is smaller than the height hM;

pulling a single crystal of silicon from the melt by the CZ method with a pulling velocity V;

heating the melt from above in the region of a phase boundary between the growing single crystal and the melt;

heating the melt from above in the region of a surface of the melt;

subjecting the melt to a magnetic field;

counterdoping the melt with p-type dopant; and separating the semiconductor wafer of single-crystal silicon from the single crystal.

The invention further provides a semiconductor wafer of single-crystal silicon which comprises oxygen, thermal donors and at least one n-type dopant and has a diameter of not less than 300 mm. The oxygen concentration of the semiconductor wafer is less than $2.2 \times 10^{17}$ atoms/$cm^3$, preferably less than $2.0 \times 10^{17}$ atoms/$cm^3$, and in the radial direction deviates from an average value by not more than 5%. The density of thermal donors in the semiconductor wafer is not more than $3×10^{13}/cm^3$.

DETAILED DESCRIPTION OF THE PREFERRED EMBODIMENTS

Figure 1:
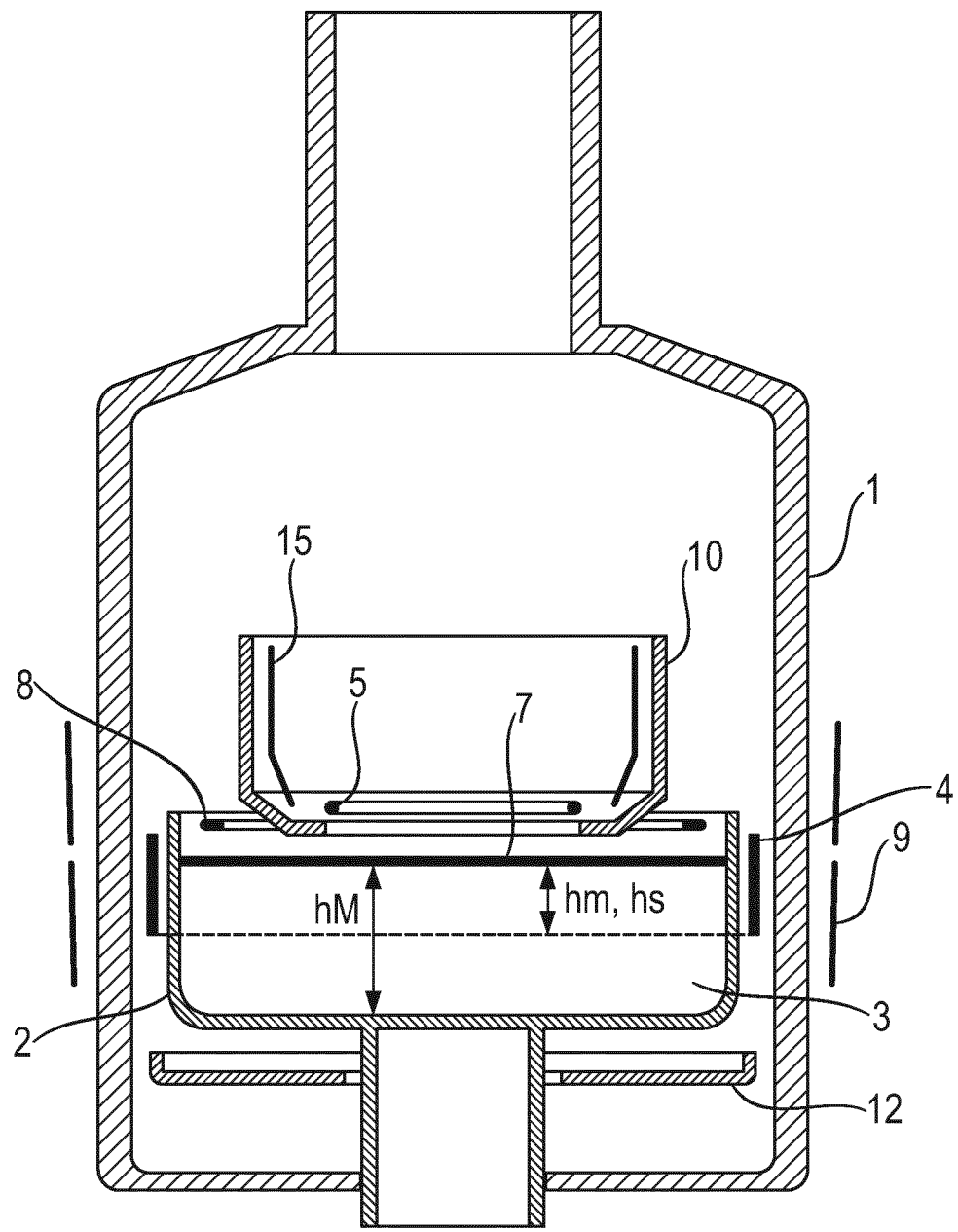
FIG. 1 is a schematic diagram of an apparatus for producing a semiconductor wafer of single-crystal silicon by the CZ method having features of the invention before pulling of a single crystal.

It is preferable when the deviation of the oxygen concentration from an average value in an edge region comprising the radial positions of 130 mm to 150 mm is not more than 10%.

The inventors have found that a range of measures must be taken to achieve the objects. Flow conditions and a temperature field in the melt are generated in the present invention which impede the dissolution of oxygen from the crucible material and promote the escape of SiO from the melt via the surface of the melt and which facilitate that oxygen is absorbed in the growing single crystal with homogeneous distribution from the center to the edge of the single crystal. Furthermore, during pulling of the single crystal the pulling velocity and the cooling rate of the single crystal are controlled to keep the concentration of the thermal donors in the single crystal low.

The melt of silicon which comprises n-type dopant, is preferably provided by melting polycrystalline silicon and n-type dopant, for example phosphorus, in a quartz crucible.

During pulling of a single crystal heat is supplied to the melt from at least three locations. From above in the region of the phase boundary between the growing single crystal and the melt, from above in the region of the surface of the melt and selectively from the side to the upper half of the melt. Furthermore, the melt may additionally be heated from below, for example to relieve the heating output at at least one of the at least three locations while ensuring that the total heating output is maintained. For example it may be advantageous to reduce the supply of heat from the side in order to protect the quartz crucible and to counteract the upper part of the crucible wall losing its shape and tipping over into the melt.

The supply of heat to the melt is preferably effected such that the heating output as a proportion of the total heating output in the case of heating the melt from above in the region of the phase boundary is not less than 5% and not more than 15% and in the case of heating the melt from above in the region of the surface is not less than 5% and not more than 15%. If the melt is additionally heated from below the heating output expended therefor as a proportion of the heating output expended for heating the melt from the side is preferably not more than 5%.

The supply of heat from the side must be oriented selectively toward an upper proportion of the volume of the melt. In other words, an intentional heating from the side of a lower proportion of the volume of the melt does not take place at the beginning of the crystal growing procedure and preferably not until 70% of the initial volume of the melt has become a constituent of the single crystal. The desired flow conditions and the desired temperature field in the melt cannot otherwise be generated. The process accordingly comprises selectively supplying heat to an upper volume of the melt having an initial height hm, wherein the height hm is smaller than the initial height hM of the melt. The ratio hm:hM is preferably not more than 0.75. The falling of the melt caused by crystallization of the single crystal is compensated by a raising of the quartz crucible.

Furthermore a heating of the melt from above takes place, specifically both in the region of the phase boundary between the growing single crystal and the melt and in the region of the surface of the melt, more particularly in the region of the surface of the melt, between a heat shield which surrounds the growing single crystal, and the wall of the quartz crucible. Heating of both regions is effected using two heating means that are virtually unaffected by one another because the heat shield blocks additional heating of the respective other region by one of the two heating means.

The heating of the melt from above in the region of the phase boundary between the growing single crystal and the melt serves in particular to control the axial temperature gradient G at the phase boundary between the growing single crystal and the melt. It is known that the quotient V/G of the pulling velocity V and axial temperature gradient G has a determining influence on the formation of internal point defects (silicon interstitial atoms and vacancies) and agglomerates thereof. The axial temperature gradient G may be approximately calculated by simulation and substantially influenced through the construction of the immediate environment of the growing single crystal, the hot zone. The single crystal of silicon is pulled by the CZ method with a pulling velocity V, preferably with a pulling velocity V which entails a V/G such that in the growing single crystal silicon interstitial atoms do not form agglomerates and that the concentration of free vacancies whose presence facilitates the formation of thermal donors is as low as possible, preferably not more than $3×10^{14}/cm^3$. It is accordingly particularly preferable to control the quotient V/G such that from the center to the edge of the single crystal vacancies dominate without forming agglomerates detectable as COP defects (crystal originated particles) and/or that from the center to the edge of the single crystal silicon interstitial atoms dominate without forming agglomerates detectable as Lpit defects (large etch pits).

The heating of the melt from above in the region of a surface of the melt contributes to the generation of the flow conditions and the temperature field in the melt that are necessary to limit the oxygen concentration in the single crystal of silicon to less than $2.2×10^{17}$ atoms/$cm^3$.

Furthermore a magnetic field is applied to the melt, preferably a CUSP field, i.e. a magnetic field having a field line structure that is axisymmetric about the axis of rotation of the quartz crucible. The magnetic field preferably has a maximum flux density of 700-1300 gauss. The plane of the magnetic field having the lowest magnetic flux density is preferably at a distance of 80 mm to 160 mm above the surface of the melt or at a distance of 120 mm to 220 mm below the surface of the melt.

To further curtail the formation of thermal donors the process preferably comprises cooling the growing single crystal of silicon in the temperature range from 500° C. to 400° C. at a cooling rate of not less than 0.15° C./min and not more than 0.6° C./min, preferably not more than 0.25°

C./min. It was found that the concentration of thermal donors decreases with increasing cooling rate. However a cooling rate of greater than 0.6° C./min should not be sought as this is detrimental to the homogeneity of the concentration of vacancies in the radial direction. Account should accordingly be taken of the fact that the cooling rate typically increases with increasing pulling velocity.

In order to curtail the variation of the specific electrical resistance in the section of the single crystal that is further processed into semiconductor wafers of single-crystal silicon the melt is counterdoped with p-type dopant preferably by passing a gas comprising the p-type dopant, for example a mixture of diborane and argon, to the surface of the melt. This gas is then introduced into the atmosphere above the melt at a distance of preferably 5 mm to 50 mm from the surface of the melt.

To enhance the yield of semiconductor wafers of single-crystal silicon it is advantageous and thus preferable to initiate counterdoping only once at least 20%, particularly preferably at least 30%, of the section of the single crystal suitable for producing semiconductor wafers because of its uniform diameter is crystallized. Provided that counterdoping has not yet been initiated it is possible in the case of formation of dislocations in the single crystal for the material crystallized up to this juncture to be remelted and for the remelted material to be co-employed in a new crystal growth attempt because the then-resulting melt has the same composition as the originally employed melt at the start of the crystal growing procedure. If the remelted material already contains dopants of both types this is no longer the case. The relative frequency of the formation of dislocations is greatest at the beginning of the crystal growing procedure and it is accordingly advantageous to wait as long as possible before counterdoping.

The invention also provides an apparatus for producing a semiconductor wafer of single-crystal silicon by the CZ method, comprising
a quartz crucible for receiving a melt of silicon in which the melt has an initial height hM;
a device for subjecting the melt to a magnetic field;
a heat shield for shielding a growing single crystal of silicon;
a first heating means for heating the melt from the side having a lower boundary which is at a distance hs from a surface of the melt that is smaller than the initial height hM of the melt;
a second heating means for heating the melt from above in the region of a phase boundary between the growing single crystal and the melt; and
a third heating means for heating the melt from above which is arranged around the heat shield between a wall of the crucible and the heat shield.

The device for subjecting the melt to a magnetic field is preferably a device for subjecting the melt to a CUSP-type magnetic field.

The height hM of the melt refers to the greatest initial height of the melt. If the quartz crucible has a convexly downward-curving bottom the initial height hM of the melt refers to the initial height of the melt in the middle of the quartz crucible.

The first heating means for heating the melt from the side is preferably a resistance heating means and has a lower boundary. The initial distance hs between the lower boundary of the first heating means and the surface of the melt is approximately of a length equal to the initial height hm of the upper volume of the melt and is smaller than the initial height hM of the melt. The ratio hs:hM is preferably not more than 0.75.

The second and third heating means for heating the melt from above preferably comprise resistance heating means having ring-shaped heating elements. In the case of the third heating means the ring has a cross-section aspect ratio (height to width) of preferably not more than 0.35 in order to be able to give off the greatest possible proportion of heat to the surface of the melt. The distance between the ring of the third heating means and the wall of the quartz crucible and the distance of said ring from the heat shield are each preferably not less than 10 mm. The third heating means may be thermally insulated from above, preferably by a heat-insulating cover arranged thereabove.

Preferably a constituent of the apparatus according to the invention is a glass tube which is oriented toward the surface of the melt and whose lower end is at a distance of 5 mm to 50 mm from the surface of the melt. During counterdoping, gas comprising p-type dopant is passed through the glass tube.

The apparatus according to the invention may further comprise a cooling apparatus which surrounds the growing single crystal.

The features cited in connection with the abovedescribed embodiments of the process according to the invention may be correspondingly applied to the apparatus according to the invention. Conversely, the features cited in connection with the abovedescribed embodiments of the apparatus according to the invention may be correspondingly applied to the process according to the invention. These and other features of the embodiments according to the invention are elucidated in the description of the figures and in the claims. The individual features may be realized either separately or in combination as embodiments of the invention. Said features may further describe advantageous implementations eligible for protection in their own right.

The invention is more particularly elucidated hereinbelow with reference to drawings.

The apparatus according to FIG. 1 comprises a housing 1 in which a quartz crucible 2 is accommodated. The quartz crucible 2 may be rotated, raised and lowered. Located in the quartz crucible 2 is a melt 3 of silicon which is heated from above, from the side and, in the working example shown, also from below. Provided outside the housing 1 is a device 9 for subjecting the melt 3 to a magnetic field. A first heating means 4 which is arranged around the quartz crucible 2 is available for heating the melt 3 from the side. A second heating means 5 for heating the melt 3 from above in the region of a phase boundary between a growing single crystal 6 and the melt 3 is arranged a short distance from the surface 7 of the melt 3 as is a third heating means 8 provided for heating the melt from above in the region of the surface 7 of the melt 3. Located between the second and the third heating means is a heat shield 10 which surrounds the growing single crystal 6 which is pulled upward away from the surface 7 of the melt 3. The distance between a lower end 11 of the heat shield 10 and the surface 7 of the melt 3 remains essentially unchanged during the growth of the single crystal 6 since the quartz crucible 2 is raised such that the surface 7 of the melt 3 does not fall nor rise despite the growth of the single crystal 6. Arranged concentrically to the heat shield 10 and surrounded thereby is a cooling apparatus 15. Located under the quartz crucible 2 is a fourth heating means 12 for heating the melt from below.

Figure 2:
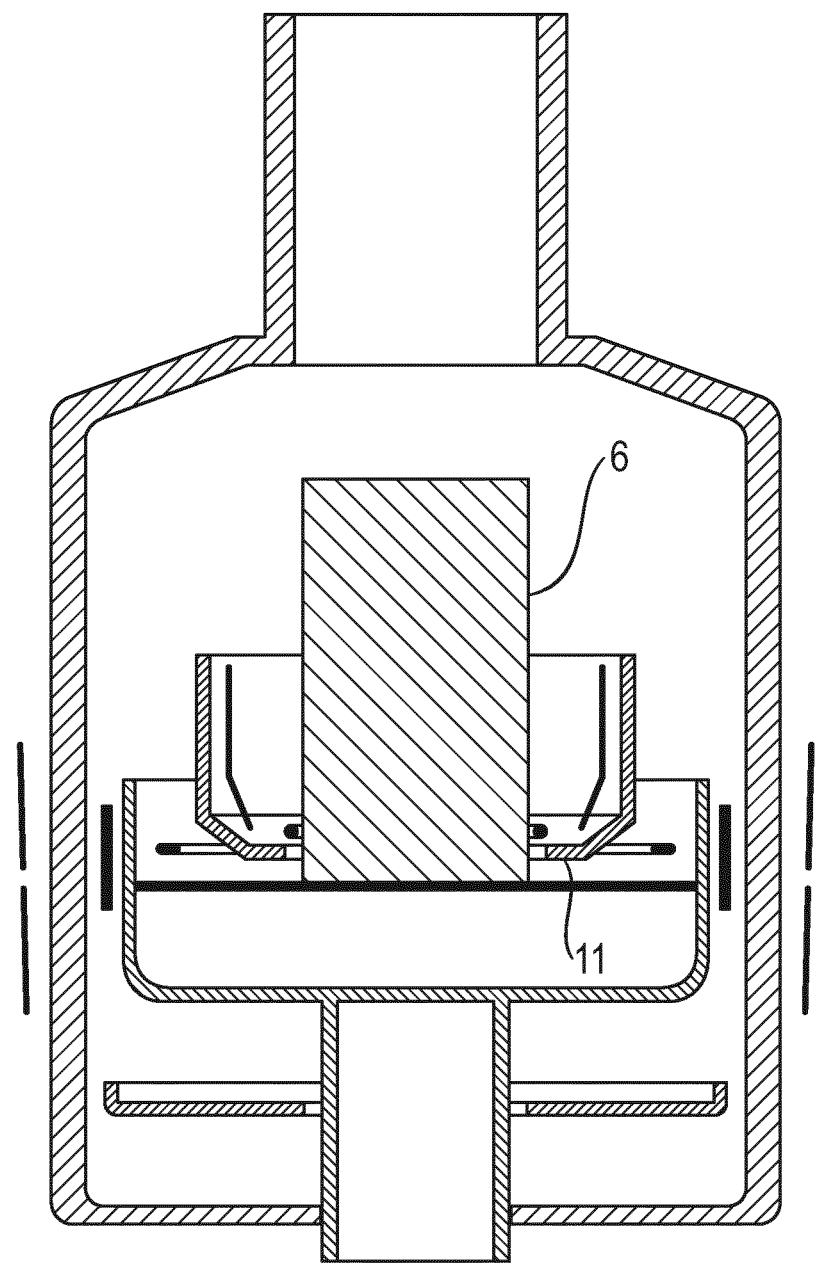
FIG. 2 shows the apparatus according to FIG. 1 during pulling of a single crystal.

As depicted in FIG. 2 the distance between the lower end 11 of the heat shield essentially does not change during pulling of the single crystal 6. The same does not apply to the distance hs between the lower boundary of the first heating means 4 and the surface of the melt 7 which falls on account of the raising of the quartz crucible 2 over the course of the growth of the single crystal 6.

Figure 3:
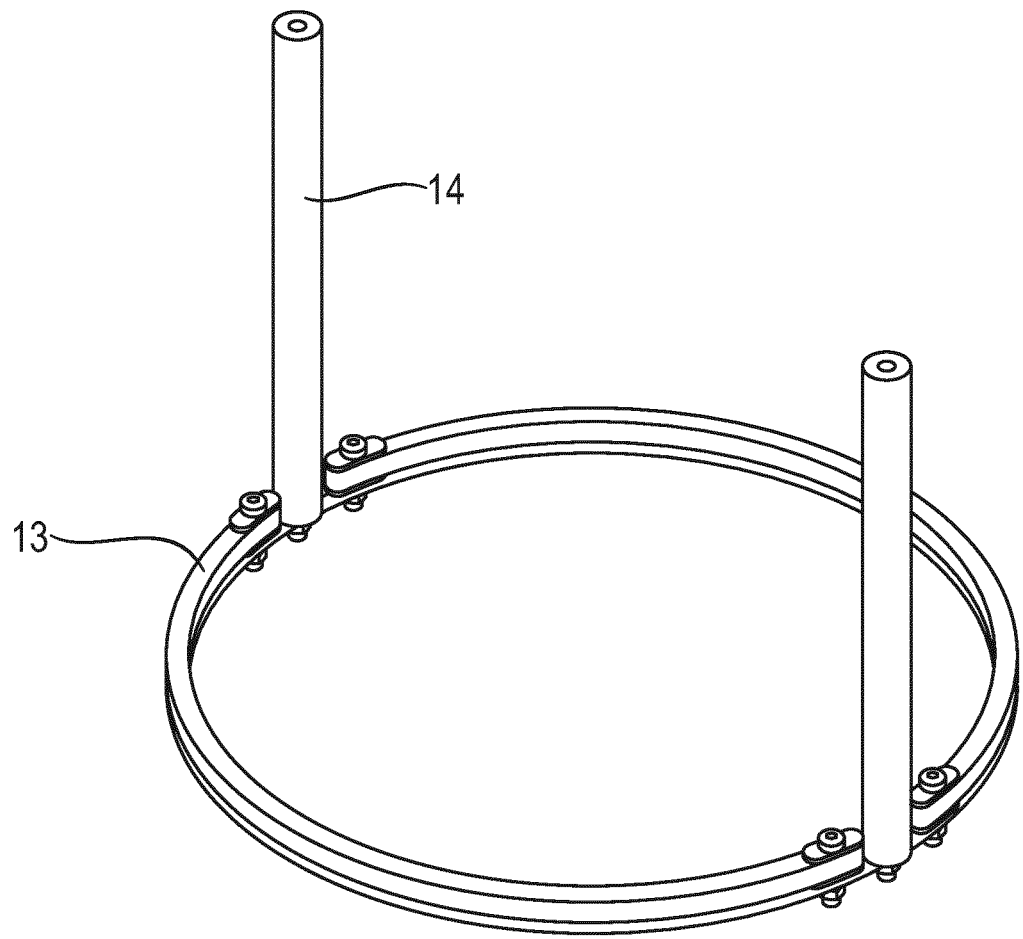
FIG. 3 shows a possible configuration of the heating means for heating the melt from above in the region of the surface of the melt.

The third heating means 8 may be configured as is depicted in FIG. 3. This heating means essentially comprises a ring 13 which functions as a heating element and power supplies 14 for supplying electrical power into the ring and for holding the ring over the surface 7 of the melt.

LIST OF REFERENCE NUMERALS EMPLOYED 1 housing
2 quartz crucible
3 melt
4 first heating means
5 second heating means
6 single crystal
7 surface of the melt
8 third heating means
9 device for subjecting the melt to a magnetic field
10 heat shield
11 lower end of the heat shield
12 fourth heating means
13 ring
14 power supplies
15 cooling apparatus Detailed Description of Inventive Working Examples Single crystals of silicon were pulled by the CZ method in an apparatus having features according to the invention and processed into n-doped semiconductor wafers having a diameter of 300 mm.

The oxygen concentration of a large portion of the semiconductor wafers was less than $2.2 \times 10^{17}$ atoms/cm$^3$ (new ASTM) and the radial profile of the oxygen concentration was very homogeneous right up to the edge region.

Figure 4:
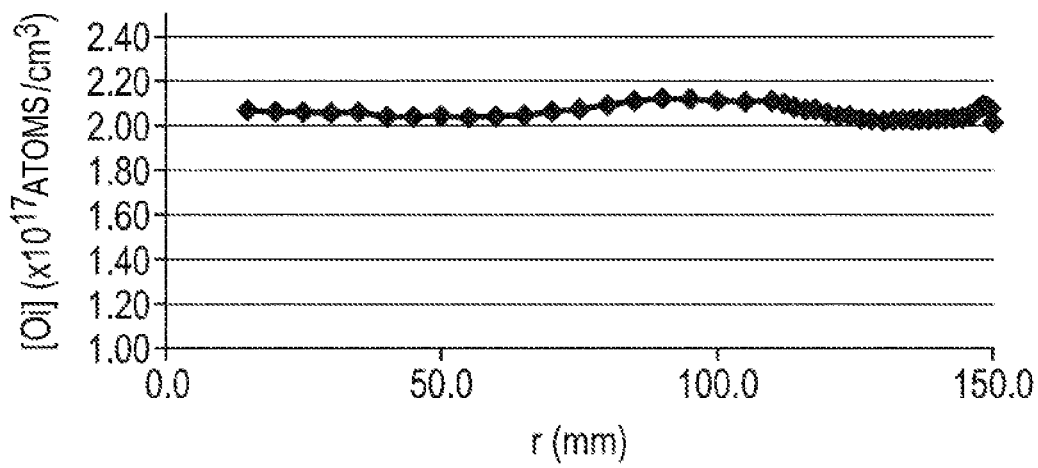
FIG. 4 shows oxygen concentration as a function of radial position.
Figure 5:
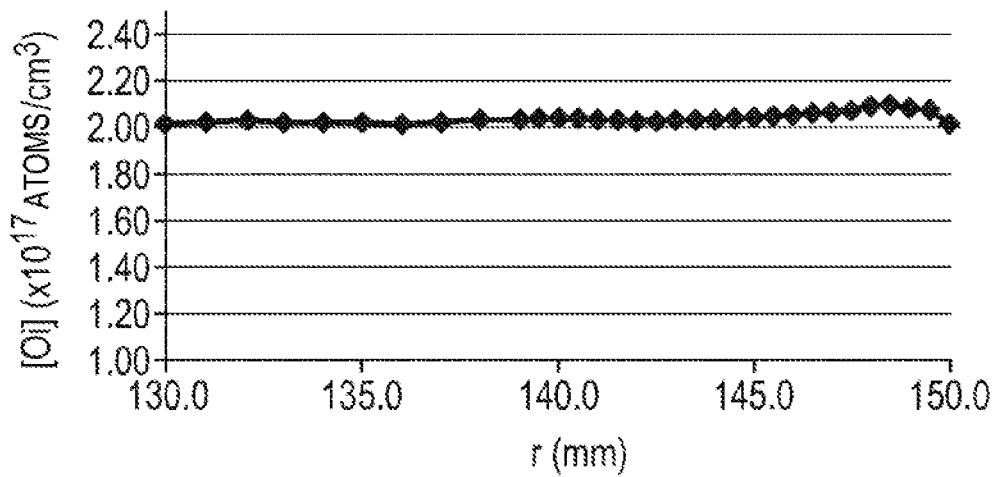
FIG. 5 shows a detailed oxygen profile in an edge area.

FIG. 4 shows the typical profile of the concentration of interstitial oxygen $[O_i]$ for such semiconductor wafers as a function of the radial position r and FIG. 5 shows in higher resolution the corresponding concentration profile in an edge region comprising the radial positions 130 mm to 150 mm.

The density of thermal donors in these semiconductor wafers was less than $3 \times 10^{13}$/cm$^3$ and was determined by resistance measurement. Resistance measurement was effected before and after an RTA heat treatment at 743° C. over a period of 10 s. The dopant concentration calculated from the difference in resistance corresponds to the density of thermal donors.

In some cases the pulling of the section of the single crystal having a uniform diameter and the counterdoping were initiated simultaneously and in some cases the counterdoping was introduced only after 40% of the length of the section had been crystallized. It was found that the later counterdoping achieved a yield increase of 10% when the semiconductor wafers were required to conform to the prescription that from the center to the edge of the semiconductor wafers the oxygen concentration is less than $2.2 \times 10^{17}$ atoms/cm$^3$ and the specific resistance deviates from the average value by not more than 13%.

The above description of illustrative embodiments is to be understood as being exemplary. The disclosure made thereby enables a person skilled in the art to understand the present invention and the advantages associated therewith and also comprehends alterations and modifications to the described structures and processes that are obvious to a person skilled in the art. All such alterations and modifications and also equivalents shall therefore be covered by the scope of protection of the claims.

The invention claimed is:

1. A process for producing a semiconductor wafer of single-crystal silicon which comprises oxygen and at least one n-type dopant, comprising:
   providing a melt of silicon which comprises an n-type dopant in a quartz crucible, wherein a surface of the melt has an initial height hM;
   heating the melt from the side by selectively supplying heat to an upper volume of the melt having an initial height hm, wherein the height hm is smaller than the height hM;
   pulling a growing single crystal of silicon from the melt by the CZ method with a pulling velocity V;
   heating the melt from above in the region of a phase boundary between the growing single crystal and the melt and between the growing single crystal and a heat shield;
   heating the melt from above in the region of the surface of the melt between the heat shield and a wall of the quartz crucible;
   subjecting the melt to a magnetic field;
   counterdoping the melt with p-type dopant; and
   separating the semiconductor wafer of single-crystal silicon from the single crystal.

2. The process of claim 1, further comprising heating the melt from below with a first heating output which, as a proportion of a second heating output with which the melt is heated from the side, is not more than 5%.

3. The process of claim 1, comprising heating the melt from above in the region of the phase boundary with a third heating output which, as a proportion of a total heating output, is not less than 5% and not more than 15%.

4. The process of claim 2, comprising heating the melt from above in the region of the phase boundary with a third heating output which, as a proportion of a total heating output, is not less than 5% and not more than 15%.

5. The process of claim 1, comprising heating the melt from above in the region of the surface of the melt with a fourth heating output which, as a proportion of the total heating output, is not less than 5% and not more than 15%.

6. The process of claim 2, comprising heating the melt from above in the region of the surface of the melt with a fourth heating output which, as a proportion of the total heating output, is not less than 5% and not more than 15%.

7. The process of claim 4, comprising heating the melt from above in the region of the surface of the melt with a fourth heating output which, as a proportion of the total heating output, is not less than 5% and not more than 15%.

8. The process of claim 1, wherein during counterdoping, a gas comprising a p-type dopant is introduced into an atmosphere above the melt at a distance of 5 mm to 50 mm from the surface of the melt.

9. The process of claim 1, further comprising pulling at least 20% of a section of the single crystal having a uniform diameter before initiating counterdoping.

10. The process of claim 1, further comprising controlling the pulling velocity V such that silicon interstitial atoms in the growing single crystal do not form agglomerates, and the concentration of free vacancies is not more than $3 \times 10^{14}$/cm$^3$.

11. The process of claim 1, further comprising cooling the growing single crystal of silicon in the temperature range from 500° C. to 400° C. at a cooling rate of not less than 0.15° C./min and not more than 0.6° C./min.

12. The process of claim 1, wherein the magnetic field is a CUSP-type magnetic field.

13. An apparatus for growing a silicon single crystal for producing a semiconductor wafer of single-crystal silicon by the method of claim 1, comprising
- a quartz crucible for receiving a melt of silicon wherein a surface of the melt has an initial height hM;
- a magnetic field producing device for subjecting the melt to a magnetic field;
- a heat shield above the surface of the melt between the silicon single crystal and a wall of the crucible configured for thermally shielding a growing single crystal of silicon;
- a first heater for heating the melt from a side of the melt, having a lower boundary which is lower than the surface of the melt having an initial height hM, wherein a distance hs of the lower boundary to the surface of the melt having the initial height hM is smaller than the initial height hM, wherein the first heater is configured to selectively supply heat to an upper volume of the melt;
- a second heater positioned above the surface of the melt between the silicon single crystal and the heat shield for heating the melt from above in the region of a phase boundary between the growing single crystal and the melt; and
- a third heater for heating the melt from above which is arranged around the heat shield between the wall of the quartz crucible and the heat shield.

14. The apparatus of claim 13, wherein the third heater comprises a ring having a cross-section aspect ratio of height to width of not more than 0.35.

15. The apparatus of claim 13, wherein the magnetic field producing device generates a CUSP-type magnetic field.

16. The apparatus of claim 13, further comprising a cover which is arranged above the third heater and thermally insulates the third heater from above.

17. The apparatus of claim 13, further comprising a fourth heater for heating the quartz crucible from below the crucible.

18. The apparatus of claim 13, further comprising a cooling device which surrounds the growing single crystal.

19. An apparatus for producing a silicon single crystal for producing semiconductor wafers of single-crystal silicon, by the CZ method, comprising
- a quartz crucible for receiving a melt of silicon in which the melt has an initial height hM;
- a magnetic field producing device for subjecting the melt to a magnetic field;
- a heat shield configured for thermally shielding a growing single crystal of silicon;
- a first heater for heating the melt from a side of the melt, the first heater having a lower boundary which is lower than the surface of the melt having the initial height hM, wherein a distance hs of the lower boundary to the surface of the melt having the initial height hM is smaller than the initial height hM, wherein the first heater is configured to selectively supply heat to an upper volume of the melt;
- a second heater for heating the melt from above in the region of a phase boundary between a growing single crystal and the melt and between the growing crystal and the heat shield; and
- a third heater for heating the melt from above which is arranged around the heat shield between a wall of the quartz crucible and the heat shield.

20. The apparatus of claim 19, further comprising a cooler positioned within the heat shield and above a bottom of the heat shield.

* * * * *